US010227261B2

(12) United States Patent
Nara et al.

(10) Patent No.: US 10,227,261 B2
(45) Date of Patent: Mar. 12, 2019

(54) OXIDE SINTERED COMPACT, OXIDE SPUTTERING TARGET, AND OXIDE THIN FILM

(71) Applicant: JX Nippon Mining & Metals Corporation, Tokyo (JP)

(72) Inventors: Atsushi Nara, Ibaraki (JP); Hideto Seki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/542,559

(22) PCT Filed: Feb. 25, 2016

(86) PCT No.: PCT/JP2016/055554
§ 371 (c)(1),
(2) Date: Jul. 10, 2017

(87) PCT Pub. No.: WO2016/136855
PCT Pub. Date: Sep. 1, 2016

(65) Prior Publication Data
US 2018/0265412 A1 Sep. 20, 2018

(30) Foreign Application Priority Data

Feb. 27, 2015 (JP) .................. 2015-038572

(51) Int. Cl.
*H01B 1/08* (2006.01)
*C04B 35/08* (2006.01)
(Continued)

(52) U.S. Cl.
CPC ............ *C04B 35/453* (2013.01); *C04B 35/00* (2013.01); *C23C 14/08* (2013.01); *C23C 14/086* (2013.01);
(Continued)

(58) Field of Classification Search
CPC .. H01B 1/00; H01B 1/08; C04B 35/00; C04B 35/453; C23C 14/08; C23C 14/34
See application file for complete search history.

(56) References Cited

U.S. PATENT DOCUMENTS 5,458,753 A 10/1995 Sato et al.
6,528,442 B1 3/2003 Kuwano et al.
(Continued)

FOREIGN PATENT DOCUMENTS

JP S63-131101 A 6/1988
JP H02-096701 A 4/1990
(Continued)

OTHER PUBLICATIONS

Li et al "Investigation of the oxygen gas sensing performance of Ga2O3 thin films with different dopants", Sensors and Actuators B 93 (2003) 431-434. (Year: 2003).*
(Continued)

*Primary Examiner* — Mark Kopec
(74) *Attorney, Agent, or Firm* — Howson & Howson LLP

(57) ABSTRACT

A sintered compact essentially consisting of zinc (Zn), gallium (Ga), silicon (Si) and oxygen (O), wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the sintered compact satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %), and has a relative density of 90% or higher. An object of this invention is to efficiently obtain an amorphous film having high transmissivity and a low refractive index without having to introduce oxygen into the atmosphere during film deposition by DC sputtering.

20 Claims, 1 Drawing Sheet

(51) Int. Cl.
  *C23C 14/00* (2006.01)
  *C04B 35/453* (2006.01)
  *C04B 35/00* (2006.01)
  *C23C 14/08* (2006.01)
  *C23C 14/34* (2006.01)
  *H01B 5/14* (2006.01)

(52) U.S. Cl.
  CPC .......... *C23C 14/34* (2013.01); *C23C 14/3414* (2013.01); *H01B 1/08* (2013.01); *H01B 5/14* (2013.01); *C04B 2235/3284* (2013.01); *C04B 2235/3286* (2013.01); *C04B 2235/54* (2013.01); *C04B 2235/77* (2013.01)

(56) References Cited

U.S. PATENT DOCUMENTS

| | | |
|---|---|---|
| 7,674,404 B2 | 3/2010 | Osada |
| 7,682,529 B2 | 3/2010 | Osada |
| 7,686,985 B2 | 3/2010 | Osada |
| 7,699,965 B2 | 4/2010 | Ikisawa et al. |
| 8,007,693 B2 | 8/2011 | Ikisawa et al. |
| 9,045,823 B2 | 6/2015 | Osada et al. |
| 2009/0197757 A1 | 8/2009 | Fukushima |
| 2012/0103804 A1 | 5/2012 | Ikisawa et al. |
| 2013/0341181 A1 | 12/2013 | Park et al. |
| 2014/0158951 A1 | 6/2014 | Yamanobe et al. |
| 2014/0352786 A1* | 12/2014 | Lee .................. H01L 31/02167 136/262 |

FOREIGN PATENT DOCUMENTS

| | | |
|---|---|---|
| JP | H04-081701 A | 3/1992 |
| JP | H06-25838 A | 2/1994 |
| JP | 2009-256762 A | 11/2009 |
| JP | 2013-055348 A | 3/2013 |
| JP | 2013-213268 A | 10/2013 |
| JP | 2014-009150 A | 1/2014 |
| JP | 2014-141386 A | 8/2014 |
| WO | 2014/025017 A1 | 8/2013 |

OTHER PUBLICATIONS

Zheng Yan et al., "Electrical Conductivity in Transparent ZnGa2O4: Reduction and Surface-Layer Structure Transformation", Journal of the American Ceramic Society, vol. 81, Issue 1, pp. 180-186, Jan. 1998 (Abstract Only).

* cited by examiner

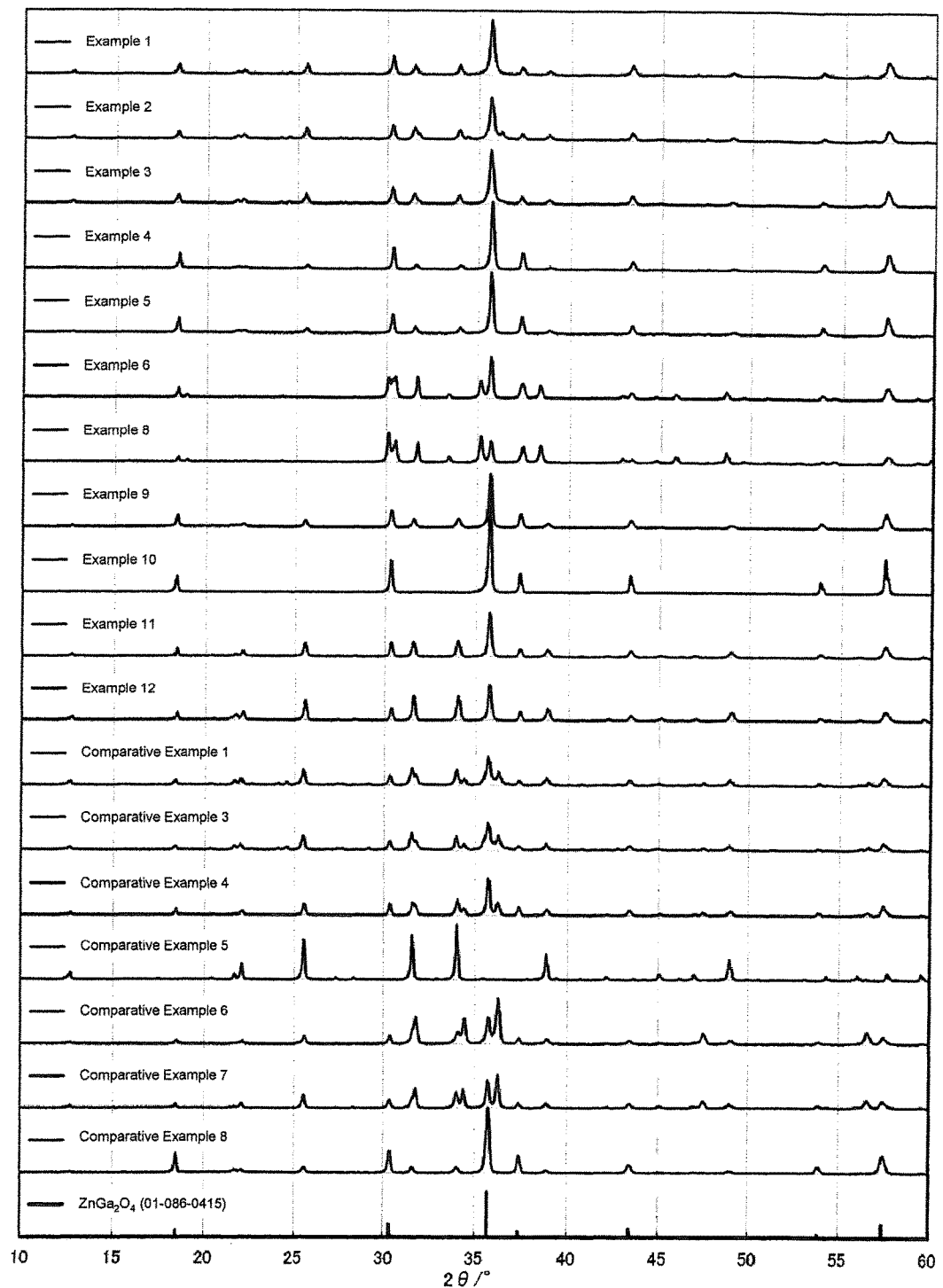

OXIDE SINTERED COMPACT, OXIDE SPUTTERING TARGET, AND OXIDE THIN FILM

BACKGROUND

The present invention relates to an oxide sintered compact, an oxide sputtering target, and an oxide thin film, and in particular relates to an oxide sputtering target which can be used in DC sputtering, and an optical adjustment oxide thin film having a low refractive index and high transmissivity produced from the foregoing oxide sputtering target.

When using visible light in various optical devices such as organic EL, liquid crystal displays and touch panels, the used material must be transparent, and in particular desirably yields high transmissivity in the entire visible light region. Moreover, with various optical devices, there are cases where optical loss arises due to a refractive index difference at the interface with the constituent film material or the substrate. In order to achieve high transmissivity, reduction in optical loss, and antireflection, there is a method of introducing an optical adjustment layer (film).

As the optical adjustment layer, films of high refractive index, medium refractive index, and low refractive index are being used as a single layer or as laminated layers according to the device structure and usage thereof (Patent Documents 1 to 3, etc.). While there are various methods for depositing this kind of optical adjustment layer, deposition via the sputtering method is especially superior as a uniform deposition means on a large area. Meanwhile, when depositing a film having a low refractive index via sputtering, there are problems in that DC sputtering cannot be adopted and the deposition rate is slow since many of the low refractive index materials (for example, $SiO_2$, MgO, and $Al_2O_3$) possess insulation properties.

In order to deal with the foregoing problem, there is a method of increasing the deposition rate by subjecting a metal target to reactive sputtering in an oxygen atmosphere. Nevertheless, when a device structure needs to use an oxygen-averse layer such as a metal film or an organic film, there is a problem in that sputtering cannot be performed in an oxygen atmosphere. Accordingly, particularly in cases of forming a film having a low refractive index, there are problems in that high-speed deposition via DC sputtering cannot be performed and the productivity is inferior.

Generally speaking, as transparent materials, IZO (indium oxide-zinc oxide), GZO (gallium oxide-zinc oxide), AZO (aluminum oxide-zinc oxide) and the like are known. For example, Patent Document 4 discloses a zinc oxide sintered compact and its production method, and Patent Documents 5 and 6 disclose a sputtering target for forming a transparent oxide film containing Al, Ga, and Si, and the remainder being Zn and unavoidable impurities.

Moreover, Patent Document 7 discloses a Zn—Si—O-based oxide sintered compact containing zinc oxide as its primary component and additionally containing Si, and to which one type of element selected from Mg, Al, Ti, Ga, In and Sn is added. Nevertheless, as described above, since a target containing a low refractive index material having a refractive index of 1.8 or less has high insulation properties, there are problems in that, depending on the composition, DC sputtering cannot be performed and the deposition rate is slow.

CITATION LIST

Patent Documents

[Patent Document 1] JP S63-131101 A
[Patent Document 2] JP 2566634 B
[Patent Document 3] JP 2915513 B
[Patent Document 4] JP 2014-009150 A
[Patent Document 5] JP 2013-055348 A
[Patent Document 6] JP 2013-213268 A
[Patent Document 7] JP 5339100 B

SUMMARY

An object of the present invention is to provide a sintered sputtering target capable of obtaining an amorphous film having favorable visible light transmissivity and a low refractive index. In particular, the present invention aims to provide a sputtering target which can be used in DC sputtering, which is capable of increasing the deposition rate and improving the productivity. The present invention additionally aims to improve the characteristics of optical devices, reduce equipment costs, and considerably improve the deposition properties.

In order to achieve the foregoing object, as a result of intense study, the present inventors discovered that DC sputtering is enabled and optical properties can be adjusted in an oxide sintered sputtering target containing Ga, Si, and Zn by adjusting the contents of the respective components, and in particular that it is possible to obtain a transparent film having high transmissivity and a low refractive index without having to introduce oxygen during film deposition.

The present invention provides the following invention based on the foregoing discovery.

1) A sintered compact essentially consisting of zinc (Zn), gallium (Ga), silicon (Si) and oxygen (O), wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the sintered compact satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %), and has a relative density of 90% or higher.
2) The sintered compact according to 1) above, wherein an atomic ratio of Zn and Ga satisfies a condition of Ga/(Ga+Zn)>0.21.
3) The sintered compact according to 1) or 2) above, wherein the sintered compact has a diffraction peak attributed to $ZnGa_2O_4$ in an X-ray diffraction.
4) The sintered compact according to any one of 1) to 3) above, wherein a volume resistivity measured with a constant current application method is 50 kΩ•cm or more.
5) The sintered compact according to any one of 1) to 4) above, wherein the relative density is 95% or higher.
6) The sintered compact according to any one of 1) to 5) above, wherein a L* value is 65 or more.
7) A sputtering target made from the sintered compact according to any one of 1) to 6) above.
8) The sputtering target according to 7) above, wherein the volume resistivity measured with the constant voltage application method upon applying a voltage of 1 V is $1\times10^6$ Ωcm or more.
9) The sputtering target according to 7) or 8) above, wherein the volume resistivity measured with the constant voltage application method upon applying a voltage of 500 V is 1/100 or less relative to the volume resistivity measured with the constant voltage application method upon applying a voltage of 1 V.
10) A thin film essentially consisting of zinc (Zn), gallium (Ga), silicon (Si) and oxygen (O), wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the thin film satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %).

11) The thin film according to 10) above, wherein a refractive index at a wavelength of 633 nm is 1.95 or less.

12) The thin film according to 10) or 11) above, wherein an extinction coefficient at a wavelength of 405 nm is 0.05 or less.

13) The thin film according to any one of 10) to 12) above, wherein the thin film is amorphous.

14) The thin film according to any one of 10) to 13) above, wherein the thin film is produced by being deposited via sputtering in an inert gas atmosphere without oxygen introduction.

According to the present invention, by adopting the foregoing material systems, it is possible to efficiently obtain an amorphous film having high transmissivity and a low refractive index without having to introduce oxygen during film deposition via DC sputtering. Moreover, the present invention yields a superior effect of being able to improve the properties of various optical devices, reduce equipment costs, increase the deposition rate, and thereby considerably improve the productivity.

BRIEF DESCRIPTION OF DRAWINGS

FIG. 1 This is a diagram showing the results from the X-ray diffraction analysis of the sintered compacts of the Examples and the Comparative Examples.

DETAILED DESCRIPTION

The present invention is a sintered compact having zinc (Zn), gallium (Ga), silicon (Si) and oxygen (O) as its constituent elements, wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the sintered compact satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %). By adopting this kind of composition, the resistance decreases during high voltage application, and DC sputtering is thereby enabled. Moreover, it is possible to deposit a transparent film having a low refractive index and high transmissivity without having to introduce oxygen during sputter deposition.

While the sintered compact of the present invention comprises zinc (Zn), gallium (Ga), silicon (Si) and oxygen (O) as its constituent elements, the sintered compact contains unavoidable impurities. Moreover, the present invention prescribes the content of the respective metals in the sintered compact by expressing it in terms of oxides, and this is because the blending of raw materials is adjusted using the oxides, and is convenient for explaining the scope and technical significance thereof. With a standard analyzing apparatus, it is possible to identify the content (weight %) of each metal element, and not the oxide. Accordingly, in order to identify the respective compositions of the target, the content of the respective metal elements can be identified based on the amount (mol %) that is expressed in terms of the respective oxides.

An oxide of Ga contributes to the conductivity, as an n-type dopant, of zinc oxide (ZnO), and an oxide of Si is a vitrified component (glass forming oxide) and is an effective component for the amorphization (vitrification) of the film. Moreover, since these oxides are materials that have a lower refractive index than zinc oxide (ZnO), the refractive index of the film can be reduced by adding these oxides. Meanwhile, the resistivity tends to increase when the composition is adjusted (ZnO is reduced) to lower the refractive index. Accordingly, since the resistivity of the sintered compact will increase and DC sputtering will become difficult when the additive amount of the oxide of Ga and the oxide of Si is increased, the additive amount of these oxides is limited to be a fixed amount or less.

Nevertheless, with the compositional range specified in the present invention, extremely unprecedented characteristics of the resistivity decreasing when high voltage is applied, and thereby enabling DC sputtering, were yielded. Thus, the present inventors conducted additional tests with an ohmmeter (insulation resistance tester) regarding the foregoing phenomenon. When the voltage applied to the sintered compact of Comparative Example 2 was increased (50 V, 125 V, 250 V, 500 V), the resistivity decreased drastically at the point of 500 V (refer to Table 2). However, because the sintered compact of Comparative Example 2 had a comparatively low relative density, it was not possible to perform DC sputtering with the foregoing decreased resistance. Consequently, when the density of the sintered compact was increased (Example 1 and Example 3), a low resistance was already attained at the applied voltage of 50 V, and DC sputtering was possible (refer to Table 2). While the detailed mechanism of this decrease in resistance during the application of a high voltage is not yet clear, it is considered to be influenced by the $ZnGa_2O_4$ phase.

The volume resistivity was measured with a high resistivity meter of a constant voltage application method (applied voltage of 1 to 1000 V: variable). When a low voltage (1 V) was applied, the volume resistivity was of a high resistance at $1 \times 10^6$ Ωcm or more; but when a voltage of 500 V was applied and the volume resistivity was 1/100 or less relative to the volume resistivity during the application of a voltage of 1 V, at least DC sputtering was enabled. The sintered compact (sputtering target) of the present invention is characterized in that the resistivity decreases drastically when a high voltage is applied as described above.

The sintered compact of the present invention satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %), but when deviating from the foregoing condition, other than complex oxides such as $ZnGa_2O_4$ and $Zn_2SiO_4$ described above, ZnO as a single phase will exist. When a ZnO single phase exists, an oxygen defect of ZnO will occur during the production or use of the target, and, unless oxygen is introduced during the sputter deposition, an oxygen deficient film will be produced, which will cause the absorption of light, and thereby high transmissivity cannot be attained. Accordingly, in order to achieve high transmissivity, it is essential to introduce oxygen into the atmosphere during the deposition by sputtering.

Note that DC sputtering can improve the throughput since the deposition rate is fast and the sputtering efficiency is superior in comparison to RF sputtering. The sintered compact of the present invention can also be subject to RF sputtering.

The sintered compact of the present invention preferably satisfies a condition of Ga/(Ga+Zn)>0.21 when the Zn content is Zn (at %), and the Ga content is Ga (at %). When Ga/(Ga+Zn) is 0.21 or less; that is, when the Ga content is low, the $ZnGa_2O_4$ phase will decrease and the effect of achieving a low resistance during the application of a high voltage cannot be yielded. Moreover, pursuant to the decrease in the Ga content, a ZnO phase or a Ga-doped ZnO phase may increase and cause the foregoing problem of oxygen defects. Accordingly, the contents of Zn and Ga preferably satisfy the condition of B/(A+B)>0.21.

Moreover, the sintered compact of the present invention preferably has a diffraction peak attributed to $ZnGa_2O_4$ in an X-ray diffraction. The X-ray diffraction peak attributed to $ZnGa_2O_4$ is observed near $2\theta=35$ to $36°$ as a peak that is attributed to a (311) plane. Moreover, the existence of a complex oxide such as $ZnGa_2O_4$ is one factor that enables DC sputtering even when the volume resistivity of the sintered compact (target) measured with the constant current application method is high, and the present invention promotes the generation of such a complex oxide which yields the foregoing effect.

Substances that obstruct the generation of this kind of complex oxide are undesirable, such as $GeO_2$ and $B_2O_3$ as glass forming oxides. These materials form a complex oxide with $Ga_2O_3$ and obstruct the generation of $ZnGa_2O_3$, and therefore they cannot be used as a substitute of $SiO_2$. Moreover, there is also Al as a metal having the same valence (trivalent) as Ga, but $Al_2O_3$ forms a complex oxide with $SiO_2$ and obstructs the generation of $ZnAl_2O_4$, and therefore it cannot be used as a substitute of $Ga_2O_3$. Moreover, there is also B (boron) as a metal having the same valence (trivalent) as Ga, but $B_2O_3$ has trouble with water resistance, and therefore the use thereof is undesirable.

The sintered compact (sputtering target) of the present invention is characterized in that a volume resistivity measured with a constant current application method is 50 kΩ•cm or more. Note that, while the present specification refers to the volume resistivity measured with the constant current application method as "the volume resistivity/bulk resistivity based on low resistivity measurement" and refers to the volume resistivity measured with the constant voltage application method as "the volume resistivity based on high resistivity measurement", this is in order to differentiate the volume resistivity based on the different measurement methods.

Generally speaking, when the bulk resistivity is 1 kΩ•cm or more, it is assumed that DC sputtering is difficult. However, the sintered compact of the present invention is unique in that DC sputtering is possible even when the resistance is high at 50 kΩ•cm or more. In addition, when using the sintered compact of the present invention as a sputtering target, the relative density is preferably 90% or higher. Moreover, since further increase in density will improve the uniformity of the sputtered film and inhibit the generation of particles during sputtering, the relative density is more preferably 95% or higher. A high density sintered compact can be realized based on the production method described later.

Furthermore, the sintered compact of the present invention preferably has a L* value of 65 or more. In a L*a*b* color system, lightness is represented as L*, and the chromaticity which indicates the hue and chroma is represented as a*, b* (JIS28781-4: 2003). In the lightness L*, L*=0 indicates black, and L*=100 indicates white. With a ZnO-based sintered compact, the outer color tends to become black due to an oxygen defect. When a target with this kind of oxygen defect is used for sputtering, an oxygen defect also occurs in the formed film to induce absorption of light, and thereby the introduction of oxygen during film deposition becomes essential. A high L* value (closer to white) means less oxygen defect. By using a sintered compact having a high L* value, it is possible to obtain a film having high transmissivity without having to introduce oxygen during sputtering.

The thin film of the present invention can be deposited by using the foregoing sintered sputtering target. It has been confirmed that the obtained thin film has substantially the same component composition as the sputtering target (sintered compact). Generally speaking, a material having a specific refractive index is required for preventing reflection and reducing optical loss, but the required refractive index will differ depending on the device structure (refractive index of the peripheral layers of the optical adjustment film). In the present invention, the refractive index at a wavelength of 633 nm can be adjusted to be 1.95 or less. Since the sintered compact of the present invention is high in contents of gallium oxide ($Ga_2O_3$) and silicon dioxide ($SiO_2$) as low refractive index materials, it is possible to obtain a film with a lower refractive index in comparison to conventional technologies.

Moreover, the thin film of the present invention can achieve an extinction coefficient of 0.05 or less at a wavelength of 405 nm without having to introduce oxygen during film deposition, and can achieve an extinction coefficient of less than 0.001 when oxygen is introduced during film deposition. Thin films for use in displays must be transparent in all visible light regions. However, generally speaking, since an oxide-based film such as an IZO film absorbs light in a short wavelength region, it was difficult to emit a vivid blue color. According to the present invention, there is hardly any absorption in a short wavelength region since the extinction coefficient at a wavelength of 405 nm is 0.05 or less, and therefore it could be said that the thin film of the present invention is extremely suitable as a transparent material.

The thin film of the present invention is preferably an amorphous film (non-crystalline film). It can be confirmed whether the obtained film is an amorphous film, for example, by observing the presence or absence of a diffraction peak that is attributed to a constituent component based on the X-ray diffraction method. For example, this can be confirmed by observing the diffraction intensity near $2\theta=34.4°$ where a peak attributed to a (002) plane of ZnO appears, or by observing the diffraction intensity near $2\theta=35.7°$ where a peak attributed to a (331) plane of $ZnGa_2O_4$ appears. Since a thin film having ZnO as its primary component crystallizes easily and has great film stress, cracks or fractures occur with a crystallized film, and the problem of the separation of the film would also arise. However, by causing the thin film to be an amorphous film, a superior effect of being able to prevent the problem of fractures and cracks caused by film stress can be yielded.

When forming a transparent film by subjecting an oxide sintered sputtering target to DC sputtering, normally, sputter deposition is performed in an atmosphere in which oxygen is introduced into argon gas. This is because, while DC sputtering is enabled by inducing an oxygen defect in the sintered compact and attaining conductivity thereby, the film will absorb light if oxygen is not introduced into the sputtering atmosphere. Nevertheless, according to the present invention, since DC sputtering can be performed without having to generate any oxygen defect, it is possible to form a film having high transmissivity and a low refractive index without having to introduce oxygen during film deposition. It could be said that this is an extremely special and beneficial effect. Note that the present invention is not denying the introduction of oxygen into the atmosphere, and oxygen may be introduced depending on the usage. In particular, it is possible to obtain a thin film having an extinction coefficient of 0.001 or less at a wavelength of 405 nm by introducing oxygen.

The sintered compact of the present invention can be produced by subjecting the mixed powder, which was obtained by weighing and mixing the raw material powders made from the oxide powders of the respective constituent metals, to pressure sintering (hot pressing) in an inert gas atmosphere or a vacuum atmosphere, or subjecting the mixed powder to press molding and thereafter subjecting the obtained compact to pressureless sintering. Here, the sintering temperature is preferably set to 900° C. or higher and 1500° C. or less. When the sintering temperature is less than 900° C., it is not possible to obtain a high density sintered compact. Meanwhile, when the sintering temperature exceeds 1500° C., compositional variation or decrease in density will occur due to the evaporation of materials, and this is undesirable. Moreover, the pressing pressure is preferably set to 150 to 500 kgf/cm$^2$.

In order to additionally improve the density, it is effective to subject the mixed powder obtained by weighing and mixing the raw material powders to calcination (synthesis) and then pulverization, and use the pulverized powder as sintering powder. By performing synthesis and pulverization in advance as described above, it is possible to obtain a uniform and fine raw material powder, and produce a dense sintered compact. The average grain size after pulverization is 5 μm or less, and preferably 2 μm or less. Moreover, the calcination temperature is preferably 800° C. or higher and 1200° C. or less. By adopting a calcination temperature within the foregoing range, the sinterability becomes favorable and even higher densification is enabled.

The evaluation methods adopted in the present invention for both the Examples and the Comparative Examples are as follows.
(Component Composition)
　Device: SPS3500DD manufactured by SII
　Method: ICP-OES (high-frequency inductively coupled plasma optical emission spectrometry)
(Density Measurement)
　Size measurement (vernier caliper), weight measurement
(Relative Density)
　Calculated using the following theoretical density.

Relative density (%)=Measured density/theoretical density×100

Theoretical density is calculated from the blending ratio of each metal element expressed in terms of oxide.

When the Zn weight expressed in terms of ZnO is a (wt %), the Ga weight expressed in terms of $Ga_2O_3$ is b (wt %), and the Si weight expressed in terms of $SiO_2$ is c (wt %), theoretical density=100/(a/5.61+b/5.95+c/2.20)

Moreover, the following values were used to calculate the density of each metal element expressed in terms of oxide.
　ZnO: 5.61 g/cm$^3$, $Ga_2O_3$: 5.95 g/cm$^3$, $SiO_2$: 2.20 g/cm$^3$
(Low Resistivity Measurement)
　Method: Constant current application method
　Device: Resistivity measuring instrument Σ-5+ manufactured by NPS
　Method: DC 4-point probe method
(High Resistivity Measurement)
　Method: Constant voltage application method
　Device: High resistivity meter Hiresta-UX manufactured by Mitsubishi Chemical Analytech
　Method: MCC-A method (JIS K 6911)
　Ring electrode probe: URS
　Measured voltage: 1 to 1000 V
(Refractive Index, Extinction Coefficient)
　Device: Spectrophotometer UV-2450 manufactured by SHIMADZU
　Method: Calculated from transmissivity and front surface/rear surface reflectance
(Film Deposition Method, Conditions)
　Device: ANELVA SPL-500
　Substrate: φ4 inches
　Substrate temperature: Room temperature
(X-ray Diffraction Analysis)
　Device: Ultima IV manufactured by Rigaku
　Tube: Cu-Kα rays
　Tube voltage: 40 kV
　Current: 30 mA
　Measurement method: 2θ-θ reflection method
　Scan rate: 8.0°/min
　Sampling interval: 0.02°
　Measured part: Sputter surface of the sintered compact (target) or the cross section perpendicular thereto is measured.
(Lightness L* Measurement)
　Device: Simplified spectrocolorimeter NF333 manufactured by Nippon Denshoku Industries
　Measured part: Arbitrary points on the sputter surface of the sintered compact (target) are measured.

EXAMPLES

The present invention is now explained based on Examples and Comparative Examples. Note that the following Examples are merely exemplifications, and the present invention is not limited to such Examples. In other words, the present invention is limited only based on the scope of its claims, and the present invention also covers the other modes and modifications included therein.

Example 1

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm$^2$. Subsequently, the obtained sintered compact was machined to shape into a target. As a result of measuring the bulk resistivity, relative density, and lightness of the obtained target, as shown in Table 1, the relative density reached 99.5%, the bulk resistivity exceeded 500 kΩcm, and the lightness L* was 96. Moreover, as shown in FIG. 3, the peak of $ZnGa_2O_4$ was confirmed in the X-ray diffraction.

Next, sputtering was performed using the foregoing target. A film was deposited to have a thickness of 7000 Å under the following sputtering conditions; namely, DC sputtering, sputter power of 500 W, and Ar gas pressure of 0.5 Pa containing 0 to 2 vol % of oxygen. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.78 (wavelength of 633 nm) and an extinction coefficient of 0.005 (wavelength of 405 nm), and the thin film that was deposited via sputtering with oxygen introduction at 2 vol % had a refractive index of 1.78 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 2

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 102.3%, the bulk resistivity exceeded 500 kΩcm, and the lightness L* was 90. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.79 (wavelength of 633 nm) and an extinction coefficient of 0.0012 (wavelength of 405 nm), and the thin film that was deposited via sputtering with oxygen introduction at 2 vol % had a refractive index of 1.78 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 3

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 100.6%, the bulk resistivity exceeded 500 kΩcm, and the lightness L* was 92. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.81 (wavelength of 633 nm) and an extinction coefficient of 0.0015 (wavelength of 405 nm), and the thin film that was deposited via sputtering with oxygen introduction at 2 vol % had a refractive index of 1.79 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 4

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 104.2%, the bulk resistivity exceeded 500 kΩcm, and the lightness L* was 81. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.77 (wavelength of 633 nm) and an extinction coefficient of 0.002 (wavelength of 405 nm), and the thin film that was deposited via sputtering with oxygen introduction at 2 vol % had a refractive index of 1.75 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 5

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 105.4%, the bulk resistivity exceeded 500 kΩcm, and the lightness L* was 80. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.83 (wavelength of 633 nm) and an extinction coefficient of 0.012 (wavelength of 405 nm), and the thin film that was deposited via sputtering with oxygen introduction at 2 vol % had a refractive index of 1.81 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 6

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 101.6%, the bulk resistivity exceeded 500 kΩcm, and the lightness L* was 70. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.83 (wavelength of 633 nm) and an extinction coefficient of 0.003 (wavelength of 405 nm), and the thin film that was deposited via sputtering with oxygen introduction at 2 vol % had a refractive index of 1.80 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 7

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 96.6%, the bulk resistivity exceeded 500 kΩcm, and the lightness L* was 82. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.84 (wavelength of 633 nm) and an extinction coefficient of 0.000 (wavelength of 405 nm), and the thin film that was deposited via sputtering with oxygen introduction at 2 vol % had a refractive index of 1.80 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 8

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 100.9%, the bulk resistivity exceeded 500 kΩcm, and the lightness L* was 80. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.81 (wavelength of 633 nm) and an extinction coefficient of 0.001 (wavelength of 405 nm), and the thin film that was deposited via sputtering with oxygen introduction at 2 vol % had a refractive index of 1.76 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 9

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 103.6%, the bulk resistivity exceeded 500 kΩcm, and the lightness L* was 85. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.73 (wavelength of 633 nm) and an extinction coefficient of 0.001 (wavelength of 405 nm), and the thin film that was deposited via sputtering with oxygen introduction at 2 vol % had a refractive index of 1.70 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 10

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 101.5%, the bulk resistivity exceeded 500 kΩcm, and the lightness L* was 79. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.93 (wavelength of 633 nm) and an extinction coefficient of 0.046 (wavelength of 405 nm), and the thin film that was deposited via sputtering with oxygen introduction at 2 vol % had a refractive index of 1.88 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 11

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1130° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 98%, the bulk resistivity exceeded 500 kΩcm, and the lightness L* was 93. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.67 (wavelength of 633 nm) and an extinction coefficient of 0.000 (wavelength of 405 nm), and the thin film that was deposited via sputtering with oxygen introduction at 2 vol % had a refractive index of 1.68 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Example 12

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1130° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 106.1%, the bulk resistivity exceeded 500 kΩcm, and the lightness L* was 83. Moreover, as shown in FIG. 3, the peak of $ZnGa_2O_4$ was confirmed in the X-ray diffraction.

Next, sputtering was performed using the foregoing target. The sputtering conditions were the same as Example 1. The bulk resistivity of the sputtering target exceeded 500 kΩcm, but it was possible to perform stable DC sputtering. The results are shown in Table 1. Note that substrate heating during sputtering and annealing after sputtering were not performed.

As shown in Table 1, the thin film that was deposited via sputtering without oxygen introduction had a refractive index of 1.72 (wavelength of 633 nm) and an extinction coefficient of 0.004 (wavelength of 405 nm), and the thin film that was deposited via sputtering with oxygen introduction at 2 vol % had a refractive index of 1.69 (wavelength of 633 nm) and an extinction coefficient of 0.000 (wavelength of 405 nm), and it was possible to obtain a film having a low refractive index and high transmissivity. Moreover, the thin film formed via sputtering was an amorphous film.

Comparative Example 1

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm². Subsequently, the obtained sintered compact was machined to shape into a target. As a result of measuring the bulk resistivity, relative density, and lightness of the obtained target, as shown in Table 1, the relative density was 99.6%, the bulk resistivity exceeded 500 kΩcm, and the lightness L* was 94. Sputtering was performed using this target under the same conditions as Example 1, but it was not possible to perform DC sputtering.

Comparative Example 2

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1100° C. and pressure of 250 kgf/cm². Subsequently, the obtained sintered compact was machined to shape into a target. As a result of measuring the bulk resistivity and relative density of the obtained target, as shown in Table 1, the relative density was 86.6% and the bulk resistivity exceeded 500 kΩcm. Sputtering was performed using this target under the same conditions as Example 1, but it was not possible to perform DC sputtering.

Comparative Example 3

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 105.6%, the bulk resistivity was $6.8 \times 10^{-1}$ Ωcm, and the lightness L* was 45.

Next, sputtering was performed using the foregoing target. The sputtering conditions were the same as Example 1. The results are shown in Table 1. Note that substrate heating during sputtering and annealing after sputtering were not performed. As shown in Table 1, the thin film that was deposited via sputtering without oxygen introduction had a refractive index of 1.87 (wavelength of 633 nm) and an extinction coefficient of 0.054 (wavelength of 405 nm), and it was not possible to obtain a film having high transmissivity.

Comparative Example 4

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1150° C. and pressure of 300 kgf/cm². Subsequently, the obtained sintered compact was machined to shape into a target. As a result of measuring the bulk resistivity, relative density, and lightness of the obtained target, as shown in Table 1, the relative density reached 105.5%, the bulk resistivity was 25.0 Ωcm, and the lightness L* was 41.

Next, sputtering was performed using the foregoing target. The sputtering conditions were the same as Example 1. The results are shown in Table 1. Note that substrate heating during sputtering and annealing after sputtering were not performed. As shown in Table 1, the thin film that was deposited via sputtering without oxygen introduction had a refractive index of 1.92 (wavelength of 633 nm) and an extinction coefficient of 0.06 (wavelength of 405 nm), and it was not possible to obtain a film having high transmissivity.

Comparative Example 5

A $SiO_2$ powder and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1050° C. and pressure of 250 kgf/cm². Subsequently, the obtained sintered compact was machined to shape into a target. As a result of measuring the bulk resistivity, relative density and lightness of the obtained target, as shown in Table 1, the relative density reached 97.6%, the bulk resistivity exceeded 500 kΩcm, and the lightness L* was 98. With this target, the peak of $ZnGa_2O_4$ could not be confirmed in the X-ray diffraction. Sputtering was performed using this target under the same conditions as Example 1, but it was not possible to perform DC sputtering.

Comparative Example 6

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1100° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 102.3%, the bulk resistivity was $5.8 \times 10^{-4}$ cm, and the lightness L* was 35.

Next, sputtering was performed using the foregoing target. The sputtering conditions were the same as Example 1. The results are shown in Table 1. Note that substrate heating during sputtering and annealing after sputtering were not performed. As shown in Table 1, the thin film that was deposited via sputtering without oxygen introduction had a refractive index of 2.08 (wavelength of 633 nm) and an extinction coefficient of 0.20 (wavelength of 405 nm), and it was not possible to obtain a film having a low refractive index and high transmissivity. Moreover, the thin film formed via sputtering was not an amorphous film.

Comparative Example 7

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1100° C. and pressure of 250 kgf/cm². Subsequently, the obtained sintered compact was machined to shape into a target. As a result of measuring the bulk resistivity, relative density, and lightness of the obtained target, as shown in Table 1, the relative density reached 88.9%, the bulk resistivity was $2.0 \times 10^{-2}$ Ωcm, and the lightness L* was 57.

Next, sputtering was performed using the foregoing target. The sputtering conditions were the same as Example 1. The results are shown in Table 1. Note that substrate heating during sputtering and annealing after sputtering were not performed. As shown in Table 1, the thin film that was deposited via sputtering without oxygen introduction had a refractive index of 2.00 (wavelength of 633 nm) and an extinction coefficient of 0.14 (wavelength of 405 nm), and it was not possible to obtain a film having a low refractive index and high transmissivity. Moreover, the thin film formed via sputtering was not an amorphous film.

Comparative Example 8

A $Ga_2O_3$ powder, a $SiO_2$ powder, and a ZnO powder were prepared according to the blending ratio indicated in Table 1, and then mixed. Subsequently, the mixed powder was calcined in the atmosphere at 1050° C., then pulverized to have an average grain size of 2 μm or less based on wet pulverization ($ZrO_2$ beads were used), dried, and thereafter classified with a sieve having a sieve mesh of 150 μm. The pulverized powder was subsequently subject to hot-pressing sintering in an argon atmosphere under the following conditions; namely, temperature of 1130° C. and pressure of 250 kgf/cm². Subsequently, the obtained sintered compact was machined to shape into a target. As a result of measuring the bulk resistivity, the relative density, and the lightness of the obtained target, as shown in Table 1, the relative density reached 102.6% and the bulk resistivity exceeded 500 kΩcm. Sputtering was performed using this target under the same conditions as Example 1, but it was not possible to perform DC sputtering.

TABLE 1

| | Composition/mol % | | | | | H/P | | Target Properties | |
| --- | --- | --- | --- | --- | --- | --- | --- | --- | --- |
| | ZnO A | $Ga_2O_3$ B | $SiO_2$ C | B + 2C | Ga/(Zn + Ga) at ratio | Temperature ° C. | Pressure kgf/cm² | Bulk Density % | Resistivity Ωcm |
| Example 1 | 51.6 | 22.9 | 25.5 | 73.9 | 0.47 | 1150 | 250 | 99.5 | >500k |
| Example 2 | 58.9 | 15.5 | 25.6 | 66.7 | 0.34 | 1150 | 250 | 102.3 | >500k |
| Example 3 | 56.3 | 20.7 | 23.0 | 66.7 | 0.42 | 1150 | 250 | 100.6 | >500k |
| Example 4 | 40.0 | 28.4 | 31.6 | 91.6 | 0.59 | 1150 | 300 | 104.2 | >500k |
| Example 5 | 50.0 | 30.0 | 20.0 | 70.0 | 0.55 | 1150 | 300 | 105.4 | >500k |
| Example 6 | 20.0 | 60.0 | 20.0 | 100.0 | 0.86 | 1150 | 300 | 101.6 | >500k |
| Example 7 | 10.0 | 70.0 | 20.0 | 110.0 | 0.93 | 1150 | 300 | 96.6 | >500k |
| Example 8 | 10.0 | 60.0 | 30.0 | 120.0 | 0.92 | 1150 | 300 | 100.9 | >500k |
| Example 9 | 40.0 | 20.0 | 40.0 | 100.0 | 0.50 | 1150 | 300 | 103.6 | >500k |
| Example 10 | 50.0 | 50.0 | 0.0 | 50.0 | 0.67 | 1150 | 250 | 101.5 | >500k |
| Example 11 | 43.3 | 13.4 | 43.3 | 100.0 | 0.38 | 1130 | 250 | 98 | >500k |
| Example 12 | 50.0 | 10.0 | 40.0 | 90.0 | 0.29 | 1130 | 250 | 106.1 | >500k |
| Comparative Example 1 | 62.5 | 8.3 | 29.2 | 66.7 | 0.21 | 1150 | 250 | 99.6 | >500k |
| Comparative Example 2 | 56.3 | 20.7 | 23.0 | 66.7 | 0.42 | 1100 | 250 | 86.6 | >500k |
| Comparative Example 3 | 68.1 | 9.0 | 22.9 | 54.8 | 0.21 | 1150 | 250 | 105.6 | 0.68 |

TABLE 1-continued

| | | | | | | | | | |
|---|---|---|---|---|---|---|---|---|---|
| Comparative Example 4 | 68.8 | 14.8 | 16.4 | 47.6 | 0.30 | 1150 | 300 | 105.5 | 25.0 |
| Comparative Example 5 | 66.7 | 0.0 | 33.3 | 66.7 | 0.00 | 1150 | 250 | 97.6 | >500k |
| Comparative Example 6 | 82.7 | 8.2 | 9.1 | 26.4 | 0.17 | 1100 | 250 | 102.3 | 0.6 m |
| Comparative Example 7 | 78.5 | 10.2 | 11.3 | 32.8 | 0.21 | 1100 | 250 | 88.9 | 20 m |
| Comparative Example 8 | 30.0 | 20.0 | 50.0 | 120.0 | 0.57 | 1130 | 250 | 102.6 | >500k |

| | Target Properties | | | Thin Film Properties | | | | |
|---|---|---|---|---|---|---|---|---|
| | | | | Ar | | 2% $O_2$ | | |
| | DC Sputtering | Lightness L* | $ZnGa_2O_4$ Peak | n 633 nm | k 405 nm | n 633 nm | k 405 nm | Film Crystallinity |
| Example 1 | Possible | 96 | Observed | 1.78 | 0.005 | 1.78 | 0.000 | Amorphous |
| Example 2 | Possible | 90 | Observed | 1.79 | 0.012 | 1.78 | 0.000 | Amorphous |
| Example 3 | Possible | 92 | Observed | 1.81 | 0.015 | 1.79 | 0.000 | Amorphous |
| Example 4 | Possible | 81 | Observed | 1.77 | 0.002 | 1.75 | 0.000 | Amorphous |
| Example 5 | Possible | 80 | Observed | 1.83 | 0.012 | 1.81 | 0.000 | Amorphous |
| Example 6 | Possible | 70 | Observed | 1.83 | 0.003 | 1.80 | 0.000 | Amorphous |
| Example 7 | Possible | 82 | Observed | 1.84 | 0.000 | 1.80 | 0.000 | Amorphous |
| Example 8 | Possible | 80 | Observed | 1.81 | 0.001 | 1.76 | 0.000 | Amorphous |
| Example 9 | Possible | 85 | Observed | 1.73 | 0.001 | 1.70 | 0.000 | Amorphous |
| Example 10 | Possible | 79 | Observed | 1.93 | 0.046 | 1.88 | 0.000 | Amorphous |
| Example 11 | Possible | 93 | Observed | 1.67 | 0.000 | 1.68 | 0.000 | Amorphous |
| Example 12 | Possible | 83 | Observed | 1.72 | 0.004 | 1.69 | 0.000 | Amorphous |
| Comparative Example 1 | Not possible | 94 | Observed | — | — | — | — | — |
| Comparative Example 2 | Not possible | 91 | Observed | — | — | — | — | — |
| Comparative Example 3 | Possible | 45 | Observed | 1.87 | 0.054 | 1.81 | 0.000 | Amorphous |
| Comparative Example 4 | Possible | 41 | Observed | 1.92 | 0.060 | 1.82 | 0.000 | Amorphous |
| Comparative Example 5 | Not possible | 98 | Not observed | — | — | — | — | — |
| Comparative Example 6 | Possible | 35 | Observed | 2.08 | 0.20 | 1.91 | 0.004 | Crystalline |
| Comparative Example 7 | Possible | 57 | Observed | 2.00 | 0.14 | 1.87 | 0.000 | Amorphous |
| Comparative Example 8 | Not possible | 85 | Observed | — | — | — | — | — |

TABLE 2

| | Relative Density/ % | Bulk Resistivity/ Ωcm | DC Sputtering | Voltage/ V | Resistance/ MΩ |
|---|---|---|---|---|---|
| Comparative Example 2 | 86.6 | >500k | Not possible | 50 | >10 |
| | | | | 125 | >20 |
| | | | | 250 | >50 |
| | | | | 500 | 7 |
| Example 1 | 99.5 | >500k | Possible | 50 | 0.03 |
| | | | | 125 | 0.04 |
| | | | | 250 | 0.06 |
| | | | | 500 | 0.04 |
| Example 3 | 100.6 | >500k | Possible | 50 | 0.1 |
| | | | | 125 | 0.08 |
| | | | | 250 | 0.05 |
| | | | | 500 | 0.07 |

Here, changes in the volume resistivity of the sintered targets illustrated in the Examples and the Comparative Examples were examined using a high resistivity meter of a constant voltage application method (applied voltage: 1 V to 1000 V: variable). The results are shown in Table 3. As shown in Table 3, in Examples 1 to 12, the volume resistivity is of a high resistance at $1 \times 10^6$ Ωcm or more when the applied voltage is 1 to 5 V, but the volume resistivity decreased to $5 \times 10^4$ Ωcm or less, which is the lower limit of measurement, when the applied voltage is 100 to 400 V.

Normally, for determining whether the DC sputtering of a sputtering target is possible, a resistivity meter of a constant current application method (measured voltage is several V or less) is used to measure the volume resistivity, and it is determined that DC sputtering is difficult when the measurement result is 1 kΩ·cm or more. Meanwhile, in the present invention, a high resistivity target of which DC sputtering is normally determined to be difficult yields an extremely unprecedented phenomenon of the resistivity decreasing only when high voltage is applied.

TABLE 3

| Voltage (V) | Volume Resistivity based on High Resistivity Measurement (Ωcm) | | | | | | |
|---|---|---|---|---|---|---|---|
| | Example 1 | Example 2 | Example 3 | Example 4 | Example 5 | Example 6 | Example 7 |
| 1 | >5E+10 | >5E+10 | >5E+10 | >5E+10 | >5E+10 | 1.47E+07 | 3.99E+08 |
| 2 | >5E+10 | >5E+10 | >5E+10 | >5E+10 | >5E+10 | 1.03E+07 | 1.05E+08 |
| 3 | >5E+10 | >5E+10 | >5E+10 | >5E+10 | >5E+10 | 5.85E+06 | 7.89E+07 |
| 4 | >5E+10 | >5E+10 | >5E+10 | >5E+10 | >5E+10 | 3.61E+06 | 1.28E+08 |
| 5 | >5E+10 | >5E+10 | >5E+10 | >5E+10 | >5E+10 | 3.17E+06 | 1.07E+08 |
| 6 | >5E+10 | >5E+10 | >5E+10 | >5E+10 | >5E+10 | 3.09E+06 | 1.15E+07 |
| 7 | >5E+10 | >5E+10 | >5E+10 | >5E+10 | >5E+10 | 2.04E+06 | 6.36E+06 |
| 8 | >5E+10 | >5E+10 | >5E+10 | >5E+10 | >5E+10 | 1.77E+06 | 3.51E+04 |
| 9 | >5E+10 | >5E+10 | >5E+10 | >5E+10 | >5E+10 | 1.26E+06 | 3.05E+04 |
| 10 | 4.98E+10 | >5E+10 | >5E+10 | 3.98E+10 | >5E+10 | 7.42E+05 | 2.64E+04 |
| 20 | 2.35E+10 | >5E+10 | 5.06E+10 | 4.67E+06 | 2.57E+10 | <5E+4 | <5E+4 |
| 30 | 4.55E+09 | >5E+10 | 4.86E+08 | 1.89E+06 | 1.77E+08 | <5E+4 | <5E+4 |
| 40 | 1.06E+08 | >5E+10 | 7.88E+06 | 5.48E+05 | 4.41E+07 | <5E+4 | <5E+4 |
| 50 | 1.66E+07 | 7.26E+06 | 5.83E+06 | 6.02E+05 | 5.93E+06 | <5E+4 | <5E+4 |
| 60 | 1.53E+06 | 3.33E+06 | 4.96E+05 | 4.62E+05 | 1.33E+06 | <5E+4 | <5E+4 |
| 70 | 4.67E+05 | 5.33E+06 | 2.47E+05 | 2.15E+05 | <5E+4 | <5E+4 | <5E+4 |
| 80 | 2.96E+05 | 2.91E+06 | 1.87E+05 | <5E+4 | <5E+4 | <5E+4 | <5E+4 |
| 90 | 1.85E+05 | 5.85E+05 | 1.34E+05 | <5E+4 | <5E+4 | <5E+4 | <5E+4 |
| 100 | <5E+4 | 6.23E+05 | <5E+4 | <5E+4 | <5E+4 | <5E+4 | <5E+4 |
| 200 | <5E+4 | <5E+4 | <5E+4 | <5E+4 | <5E+4 | <5E+4 | <5E+4 |
| 300 | <5E+4 | <5E+4 | <5E+4 | <5E+4 | <5E+4 | <5E+4 | <5E+4 |
| 400 | <5E+4 | <5E+4 | <5E+4 | <5E+4 | <5E+4 | <5E+4 | <5E+4 |
| 500 | <5E+5 | <5E+5 | <5E+5 | <5E+5 | <5E+5 | <5E+5 | <5E+5 |
| 600 | <5E+5 | <5E+5 | <5E+5 | <5E+5 | <5E+5 | <5E+5 | <5E+5 |
| 700 | <5E+5 | <5E+5 | <5E+5 | <5E+5 | <5E+5 | <5E+5 | <5E+5 |
| 800 | <5E+5 | <5E+5 | <5E+5 | <5E+5 | <5E+5 | <5E+5 | <5E+5 |
| 900 | <5E+5 | <5E+5 | <5E+5 | <5E+5 | <5E+5 | <5E+5 | <5E+5 |
| 1000 | <5E+5 | <5E+5 | <5E+5 | <5E+5 | <5E+5 | <5E+5 | <5E+5 |

| Voltage (V) | Volume Resistivity based on High Resistivity Measurement (Ωcm) | | | | |
|---|---|---|---|---|---|
| | Example 8 | Example 9 | Example 10 | Example 11 | Example 12 |
| 1 | >5E+10 | >5E+10 | >5E+10 | >5E+10 | >5E+10 |
| 2 | >5E+10 | >5E+10 | >5E+10 | >5E+10 | >5E+10 |
| 3 | >5E+10 | >5E+10 | >5E+10 | >5E+10 | >5E+10 |
| 4 | 4.97E+09 | >5E+10 | >5E+10 | >5E+10 | >5E+10 |
| 5 | 4.02E+09 | >5E+10 | >5E+10 | >5E+10 | >5E+10 |
| 6 | 3.65E+09 | >5E+10 | >5E+10 | >5E+10 | >5E+10 |
| 7 | 3.33E+09 | >5E+10 | >5E+10 | >5E+10 | >5E+10 |
| 8 | 2.87E+09 | >5E+10 | >5E+10 | >5E+10 | >5E+10 |
| 9 | 1.62E+09 | >5E+10 | >5E+10 | >5E+10 | >5E+10 |
| 10 | 1.20E+09 | >5E+10 | >5E+10 | >5E+10 | >5E+10 |
| 20 | 1.17E+07 | >5E+10 | 1.12E+06 | >5E+10 | >5E+10 |
| 30 | <5E+4 | >5E+10 | 4.82E+05 | >5E+10 | 2.19E+08 |
| 40 | <5E+4 | 3.77E+10 | 2.00E+05 | >5E+10 | 7.93E+06 |
| 50 | <5E+4 | 2.40E+09 | 1.64E+05 | 1.97E+10 | 7.61E+06 |
| 60 | <5E+4 | 1.71E+08 | 1.65E+05 | 1.10E+08 | 1.95E+07 |
| 70 | <5E+4 | 6.82E+07 | 1.04E+05 | 7.46E+07 | 2.46E+07 |
| 80 | <5E+4 | 7.81E+06 | 8.10E+04 | 5.92E+07 | 2.66E+07 |
| 90 | <5E+4 | 6.33E+06 | <5E+4 | 4.6E+07 | 4.7E+07 |
| 100 | <5E+4 | 3.22E+06 | <5E+4 | 4.1E+07 | 2.7E+07 |
| 200 | <5E+4 | <5E+4 | <5E+4 | 3.2E+06 | 6.5E+05 |
| 300 | <5E+4 | <5E+4 | <5E+4 | 8.0E+05 | <5E+4 |
| 400 | <5E+4 | <5E+4 | <5E+4 | <5E+4 | <5E+4 |
| 500 | <5E+5 | <5E+5 | <5E+5 | <5E+5 | <5E+5 |
| 600 | <5E+5 | <5E+5 | <5E+5 | <5E+5 | <5E+5 |
| 700 | <5E+5 | <5E+5 | <5E+5 | <5E+5 | <5E+5 |
| 800 | <5E+5 | <5E+5 | <5E+5 | <5E+5 | <5E+5 |
| 900 | <5E+5 | <5E+5 | <5E+5 | <5E+5 | <5E+5 |
| 1000 | <5E+5 | <5E+5 | <5E+5 | <5E+5 | <5E+5 |

| Voltage (V) | Volume Resistivity based on High Resistivity Measurement (Ωcm) | | | | | | |
|---|---|---|---|---|---|---|---|
| | Comparative Example 1 | Comparative Example 2 | Comparative Example 3 | Comparative Example 4 | Comparative Example 5 | Comparative Example 6 | Comparative Example 7 |
| 1 | >5E+10 | >5E+10 | <5E+2 | <5E+2 | >5E+10 | <5E+2 | <5E+2 |
| 2 | >5E+10 | >5E+10 | <5E+2 | <5E+2 | >5E+10 | <5E+2 | <5E+2 |
| 3 | >5E+10 | >5E+10 | <5E+2 | <5E+2 | >5E+10 | <5E+2 | <5E+2 |
| 4 | >5E+10 | >5E+10 | <5E+2 | <5E+2 | >5E+10 | <5E+2 | <5E+2 |
| 5 | >5E+10 | >5E+10 | <5E+2 | <5E+2 | >5E+10 | <5E+2 | <5E+2 |
| 6 | >5E+10 | >5E+10 | <5E+2 | <5E+2 | >5E+10 | <5E+2 | <5E+2 |
| 7 | >5E+10 | >5E+10 | <5E+2 | <5E+2 | >5E+10 | <5E+2 | <5E+2 |
| 8 | >5E+10 | >5E+10 | <5E+2 | <5E+2 | >5E+10 | <5E+2 | <5E+2 |
| 9 | >5E+10 | >5E+10 | <5E+2 | <5E+2 | >5E+10 | <5E+2 | <5E+2 |

TABLE 3-continued

| | | | | | | | |
|---|---|---|---|---|---|---|---|
| 10 | >5E+10 | >5E+10 | <5E+2 | <5E+2 | >5E+10 | <5E+2 | <5E+2 |
| 20 | >5E+10 | >5E+10 | <5E+4 | <5E+4 | >5E+10 | <5E+4 | <5E+4 |
| 30 | >5E+10 | >5E+10 | <5E+4 | <5E+4 | >5E+10 | <5E+4 | <5E+4 |
| 40 | >5E+10 | >5E+10 | <5E+4 | <5E+4 | >5E+10 | <5E+4 | <5E+4 |
| 50 | >5E+10 | >5E+10 | <5E+4 | <5E+4 | >5E+10 | <5E+4 | <5E+4 |
| 60 | >5E+10 | >5E+10 | <5E+4 | <5E+4 | >5E+10 | <5E+4 | <5E+4 |
| 70 | >5E+10 | >5E+10 | <5E+4 | <5E+4 | >5E+10 | <5E+4 | <5E+4 |
| 80 | >5E+10 | >5E+10 | <5E+4 | <5E+4 | >5E+10 | <5E+4 | <5E+4 |
| 90 | >5E+10 | >5E+10 | <5E+4 | <5E+4 | >5E+10 | <5E+4 | <5E+4 |
| 100 | >5E+11 | >5E+11 | <5E+4 | <5E+4 | 2.22E+11 | <5E+4 | <5E+4 |
| 200 | >5E+11 | >5E+11 | <5E+4 | <5E+4 | 1.67E+11 | <5E+4 | <5E+4 |
| 300 | >5E+11 | >5E+11 | <5E+4 | <5E+4 | 1.38E+11 | <5E+4 | <5E+4 |
| 400 | >5E+11 | 3.65E+11 | <5E+4 | <5E+4 | 1.23E+11 | <5E+4 | <5E+4 |
| 500 | >5E+11 | 5.25E+11 | <5E+5 | <5E+5 | 1.14E+11 | <5E+5 | <5E+5 |
| 600 | >5E+11 | 1.32E+10 | <5E+5 | <5E+5 | 1.10E+11 | <5E+5 | <5E+5 |
| 700 | 2.35E+09 | 1.27E+10 | <5E+5 | <5E+5 | 1.06E+11 | <5E+5 | <5E+5 |
| 800 | 3.64E+08 | 1.43E+10 | <5E+5 | <5E+5 | 1.03E+11 | <5E+5 | <5E+5 |
| 900 | 1.82E+08 | 2.28E+10 | <5E+5 | <5E+5 | 9.97E+10 | <5E+5 | <5E+5 |
| 1000 | <5E+5 | 8.40E+10 | <5E+5 | <5E+5 | 9.75E+10 | <5E+5 | <5E+5 |

With the sintered sputtering target of the present invention, the resistance decreases during high voltage application, and DC sputtering is thereby enabled. Accordingly, the present invention yields a superior effect of being able to deposit a transparent film having a low refractive index and high transmissivity even without having to introduce oxygen during film deposition by sputtering. DC sputtering yields significant effects of being able to facilitate the controllability of sputtering, increase the deposition rate, and improve the sputtering efficiency. Moreover, DC sputtering is also able to reduce particles (dust emission) and nodules that are generated during sputter deposition, and improve mass productivity with minimal variation in quality. The thin film formed using the target of the present invention can be used to form optical adjustment films in various displays and protective films of optical disks, and exhibits extremely superior effects in terms of transmissivity and refractive index. Furthermore, a major feature of the present invention is that it is an amorphous film, and the present invention thereby yields a superior effect of preventing cracks in the films and dramatically improving the etching performance of the films.

The invention claimed is:

1. A sintered compact consisting essentially of zinc (Zn), gallium (Ga), silicon (Si) and oxygen (O), wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the sintered compact satisfies a condition of A≤(B+2C) when the Zn content expressed in terms of ZnO is A (mol %), the Ga content expressed in terms of $Ga_2O_3$ is B (mol %), and the Si content expressed in tends of $SiO_2$ is C (mol %), and has a relative density of 90% or higher.

2. The sintered compact according to claim 1, wherein an atomic ratio of Zn and Ga satisfies a condition of Ga/(Ga+Zn)>0.21.

3. The sintered compact according to claim 2, wherein the sintered compact has a diffraction peak attributed to $ZnGa_2O_4$ in an X-ray diffraction.

4. The sintered compact according to claim 3, wherein a volume resistivity measured with a constant current application method is 50 kΩ•cm or more.

5. The sintered compact according to claim 4, wherein the relative density is 95% or higher.

6. The sintered compact according to claim 5, wherein a L* value is 65 or more.

7. A sputtering target made from the sintered compact according to claim 1.

8. The sputtering target according to claim 7, wherein the volume resistivity measured with the constant voltage application method upon applying a voltage of 1 V is $1\times10^6$ Ωcm or more.

9. The sputtering target according to claim 7, wherein the volume resistivity measured with the constant voltage application method upon applying a voltage of 500 V is 1/100 or less relative to the volume resistivity measured with the constant voltage application method upon applying a voltage of 1 V.

10. The sintered compact according to claim 1, wherein the sintered compact has a diffraction peak attributed to $ZnGa_2O_4$ in an X-ray diffraction.

11. The sintered compact according to claim 1, wherein a volume resistivity measured with a constant current application method is 50 kΩ•cm or more.

12. The sintered compact according to claim 1, wherein the relative density is 95% or higher.

13. The sintered compact according to claim 1, wherein a L* value is 65 or more.

14. A thin film consisting essentially of zinc (Zn), gallium (Ga), silicon (Si) and oxygen (O), wherein a Zn content expressed in terms of ZnO is 5 to 60 mol %, a Ga content expressed in terms of $Ga_2O_3$ is 8.5 to 90 mol %, and a Si content expressed in terms of $SiO_2$ is 0 to 45 mol %, and the thin film satisfies a condition of A≤(B+2C) when the Zn content expressed in terms of ZnO is A (mol %), the Ga content expressed in terms of $Ga_2O_3$ is B (mol %), and the Si content expressed in terms of $SiO_2$ is C (mol %).

15. The thin film according to claim 14, wherein a refractive index at a wavelength of 633nm is 1.95 or less.

16. The thin film according to claim 15, wherein an extinction coefficient at a wavelength of 405 nm is 0.05 or less.

17. The thin film according to claim 16, wherein the thin film is amorphous.

18. The thin film according to claim 17, wherein the thin film is produced by being deposited via sputtering in an inert gas atmosphere without oxygen introduction.

19. The thin film according to claim 14, wherein an extinction coefficient at a wavelength of 405 nm is 0.05 or less.

20. The thin film according to claim 14, wherein the thin film is amorphous.

* * * * *